(12) United States Patent
Matsuo et al.

(10) Patent No.: US 12,107,023 B2
(45) Date of Patent: Oct. 1, 2024

(54) POWER MODULE

(71) Applicant: KABUSHIKI KAISHA TOSHIBA, Tokyo (JP)

(72) Inventors: Keiichiro Matsuo, Yokohama (JP); Izuru Komatsu, Yokohama (JP); Haruka Yamamoto, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 25 days.

(21) Appl. No.: 17/473,196

(22) Filed: Sep. 13, 2021

(65) Prior Publication Data
US 2022/0262690 A1  Aug. 18, 2022

(30) Foreign Application Priority Data
Feb. 17, 2021  (JP) .................. 2021-023293

(51) Int. Cl.
*H01L 23/053* (2006.01)
*H01L 23/00* (2006.01)
(Continued)

(52) U.S. Cl.
CPC ............ *H01L 23/053* (2013.01); *H01L 23/15* (2013.01); *H01L 23/3121* (2013.01);
(Continued)

(58) Field of Classification Search
None
See application file for complete search history.

(56) References Cited

U.S. PATENT DOCUMENTS 10,304,788 B1 * 5/2019 Kim .................. H01L 23/24
2012/0080800 A1 * 4/2012 Shinohara .......... H01L 23/24
257/773
(Continued)

FOREIGN PATENT DOCUMENTS

JP     2010-050395 A    3/2010
JP     2012-15222 A     1/2012
(Continued)

OTHER PUBLICATIONS

Japanese Office Action dated Jul. 10, 2024, issued in Japanese Patent Application No. 2021-023293 (with English translation).

*Primary Examiner* — Michelle Mandala
*Assistant Examiner* — Jordan M Klein
(74) *Attorney, Agent, or Firm* — Oblon, McClelland, Maier & Neustadt, L.L.P.

(57) ABSTRACT

A power module includes a base plate, a casing, a substrate unit, a terminal plate, a first resin layer, and a second resin layer. The substrate unit includes a substrate fixed on the base plate, a dam part, a semiconductor chip, a metal member, and a wire. The dam part is formed along an edge of the substrate. The wire includes an electrode plate connection portion, and a chip connection portion. The first resin layer is located inward of the dam part. The chip connection portion and the electrode plate connection portion are located inside the first resin layer. The second resin layer is located on the first resin layer. The upper surface of the metal member is located inside the second resin layer. An elastic modulus of the second resin layer is less than that of the first resin layer.

10 Claims, 6 Drawing Sheets

(51) Int. Cl.
*H01L 23/15* (2006.01)
*H01L 23/31* (2006.01)
*H01L 23/492* (2006.01)

(52) U.S. Cl.
CPC ........ *H01L 23/3135* (2013.01); *H01L 23/492* (2013.01); *H01L 24/48* (2013.01); *H01L 2224/48091* (2013.01); *H01L 2224/48177* (2013.01)

(56) References Cited

U.S. PATENT DOCUMENTS

| | | |
|---|---|---|
| 2013/0009298 A1 | 1/2013 | Ota et al. |
| 2013/0306991 A1* | 11/2013 | Terai ............ H01L 23/24 257/77 |
| 2013/0341775 A1* | 12/2013 | Ota ............ H01L 23/24 257/668 |
| 2015/0076517 A1 | 3/2015 | Terai et al. |
| 2017/0221853 A1 | 8/2017 | Yoneyama et al. |
| 2019/0189553 A1* | 6/2019 | Hohlfeld ............ H01L 23/3672 |
| 2021/0090974 A1 | 3/2021 | Matsuo et al. |

FOREIGN PATENT DOCUMENTS

| | | |
|---|---|---|
| JP | 2013-16629 A | 1/2013 |
| JP | 2013-062506 A | 4/2013 |
| JP | 5832557 B2 | 12/2015 |
| JP | 2017-139304 A | 8/2017 |
| JP | 2021-52068 A | 4/2021 |
| WO | WO 2012/070261 A1 | 5/2012 |
| WO | WO 2019/176199 A | 9/2019 |

\* cited by examiner

POWER MODULE

CROSS-REFERENCE TO RELATED APPLICATIONS

This application is based upon and claims the benefit of priority from Japanese Patent Application No. 2021-023293, filed on Feb. 17, 2021; the entire contents of which are incorporated herein by reference.

FIELD

Embodiments relate to a power module.

BACKGROUND

A power module is being developed in which a semiconductor chip for power control is located inside a casing, and electrical power is input and output by connecting terminal plates to the semiconductor chip from outside the casing. In such a power module, an insulative sealing material is filled into the casing to maintain the insulation state of the internal circuits, the terminal plates, etc. The conduction amount of future power modules is anticipated to continue increasing, and countermeasures for heat generation due to conduction are problematic.

DETAILED DESCRIPTION

A power module according to one embodiment, includes a base plate, a casing, at least one substrate unit, a terminal plate, a first resin layer, and a second resin layer. The casing is located on the base plate. The substrate unit is located on the base plate. Each of the at least one substrate unit includes a substrate, a dam part, a first semiconductor chip, a metal member, and a first wire. The substrate is fixed on the base plate. The substrate includes a plurality of electrode plates at an upper surface of the substrate. The plurality of electrode plates include at least first and second electrode plates. The dam part is located on the substrate. The dam part is formed along an edge of the substrate when viewed from above. The first semiconductor chip is located on the first electrode plate. The first semiconductor chip includes a first electrode. The metal member is located on one of the electrode plates. The first wire includes an electrode plate connection portion, a chip connection portion, and a curved portion. The electrode plate connection portion is connected to the second electrode plate. The chip connection portion is connected to the first electrode. The curved portion is positioned between the electrode plate connection portion and the chip connection portion. The terminal plate is bonded to an upper surface of the metal member. The first resin layer is located on the substrate inward of the dam part. The chip connection portion and the electrode plate connection portion are located inside the first resin layer. The second resin layer is located on the first resin layer and the dam part. The upper surface of the metal member is located inside the second resin layer. An elastic modulus of the second resin layer is less than an elastic modulus of the first resin layer.

Exemplary embodiments will now be described with reference to the drawings.

The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

Figure 1:
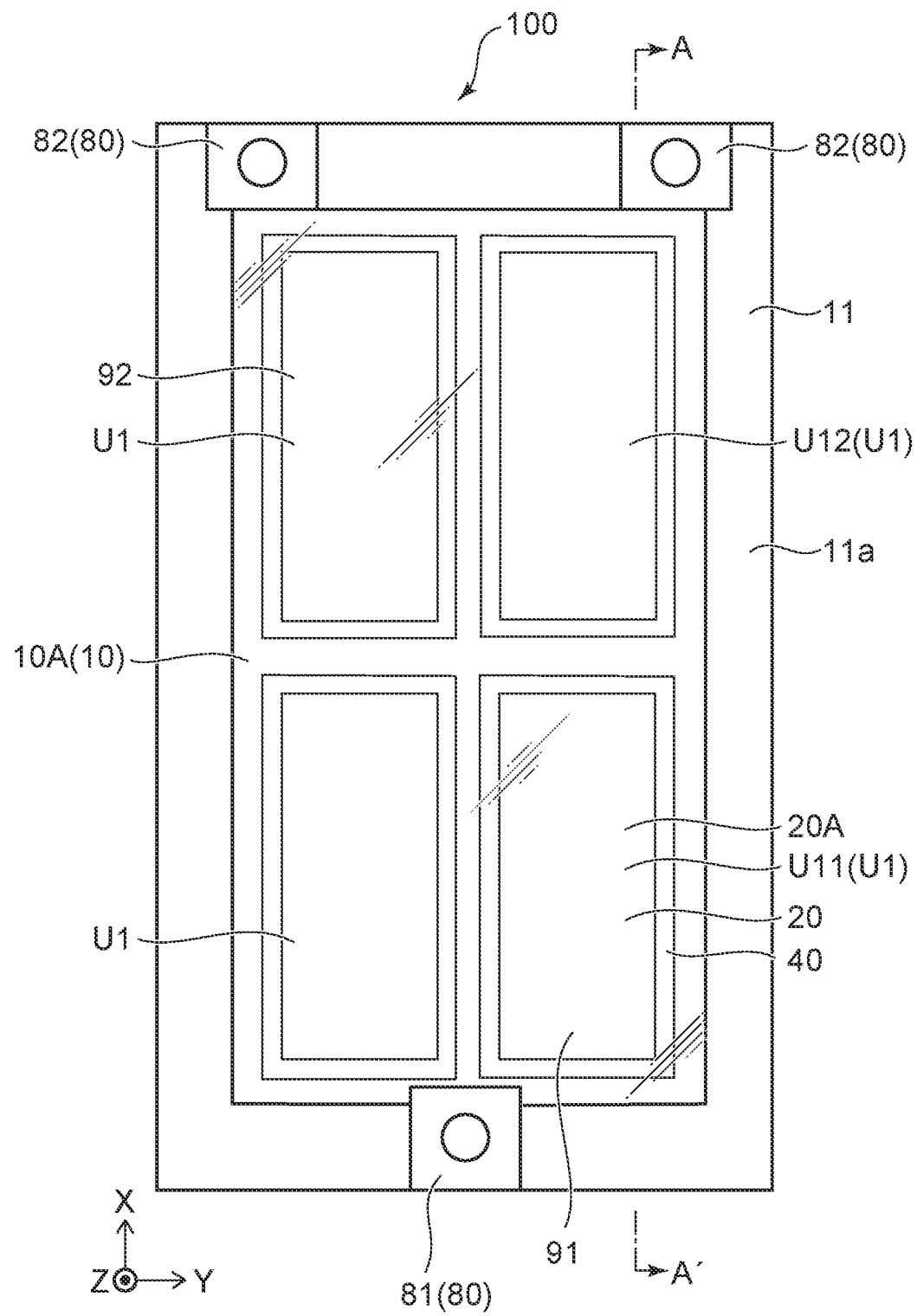
FIG. 1 is a plan view showing a power module according to an embodiment.
Figure 2:
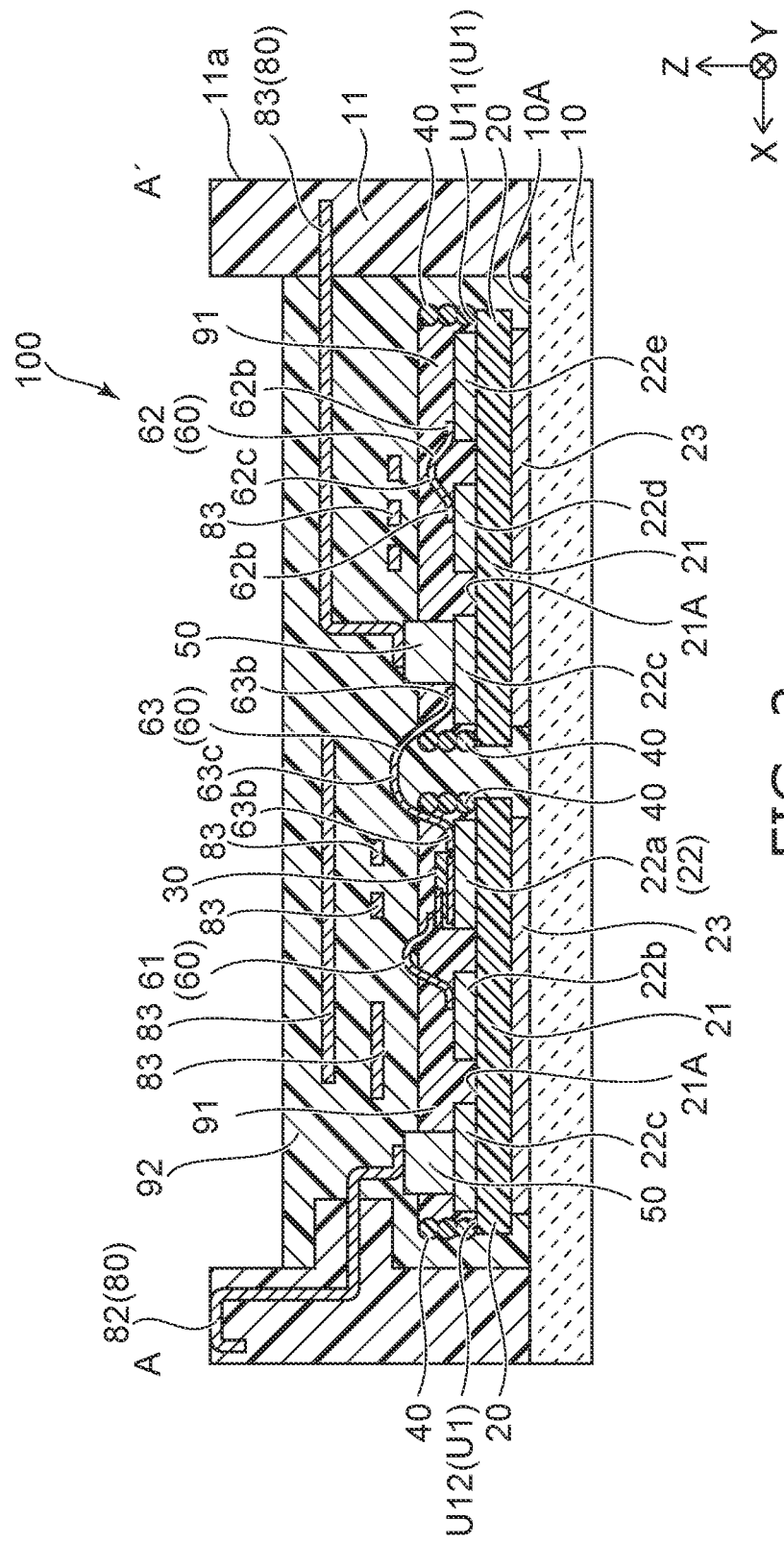
FIG. 2 is a cross-sectional view along line A-A' shown in FIG. 1.
Figure 3:
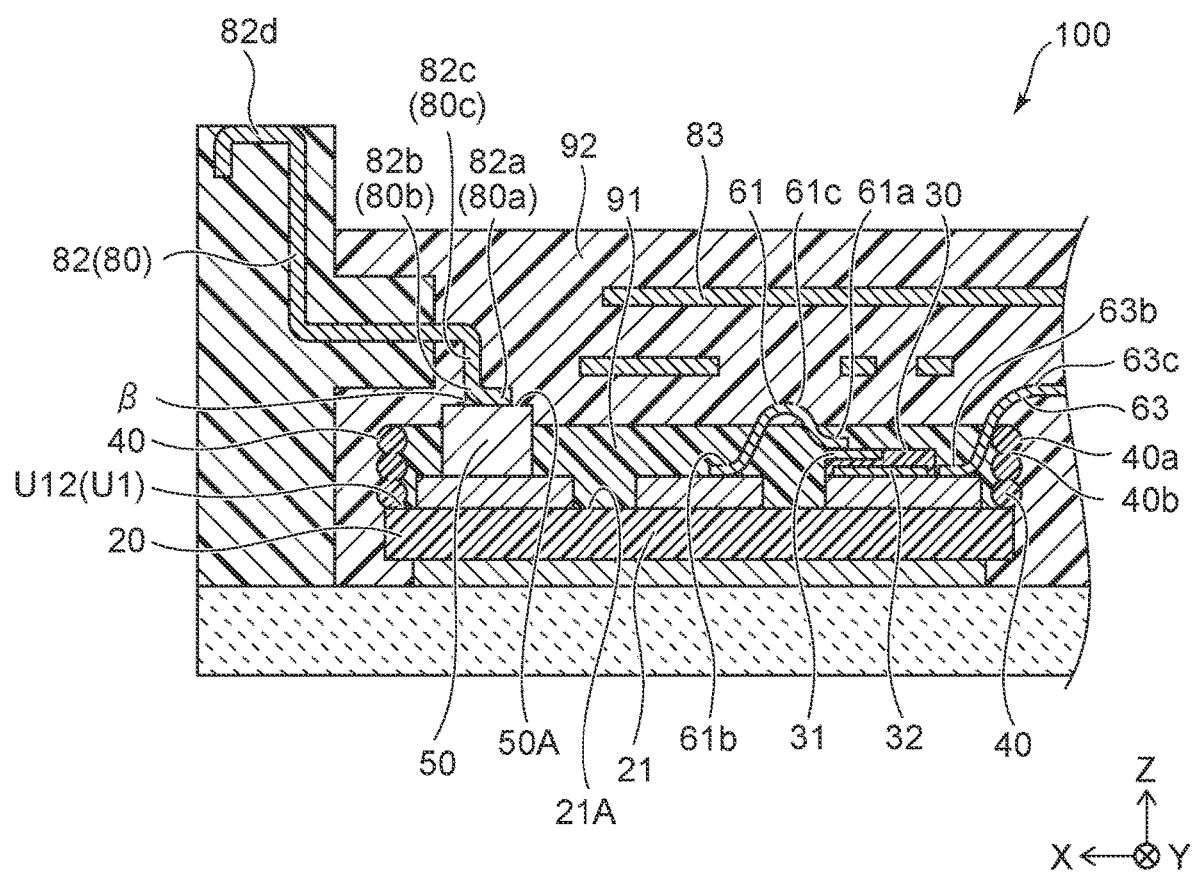
FIG. 3 is a partially enlarged cross-sectional view of FIG. 2.
Figure 4:
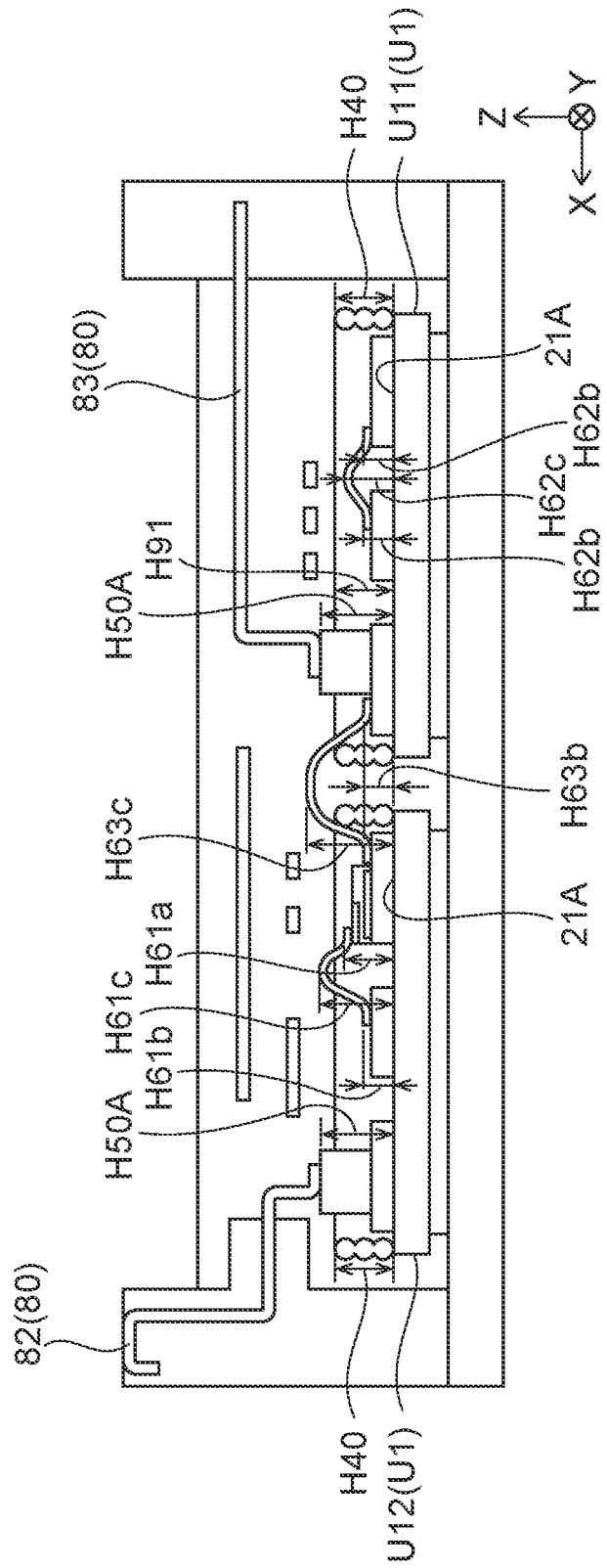
FIG. 4 is a cross-sectional view showing internal dimensions of the power module according to the embodiment.

FIG. 1 is a plan view showing a power module according to an embodiment. FIG. 2 is a cross-sectional view along line A-A' shown in FIG. 1. FIG. 3 is a partially enlarged cross-sectional view of FIG. 2. FIG. 4 is a cross-sectional view showing internal dimensions of the power module according to the embodiment. The upper surface portion of a casing 11 described below is not illustrated in FIGS. 1 to 4. Only a schematic configuration is shown in FIG. 1 to simplify the illustration.

As shown in FIGS. 1 and 2, the overall shape of the power module 100 of the embodiment is a substantially rectangular parallelepiped. The power module 100 includes the casing 11, a base plate 10, a substrate unit U1, a terminal plate 80, a first resin layer 91, and a second resin layer 92.

As shown in FIG. 2, the base plate 10 is substantially plate-shaped and includes an upper surface 10A and a bottom surface. For example, the bottom surface of the power module 100 is formed of the bottom surface of the base plate 10. For example, the base plate 10 is formed of a ceramic that includes aluminum (Al), silicon (Si), and carbon (C); specifically, the base plate 10 is formed of a metal-based ceramic composite material (AlSiC).

The casing 11 includes a side surface portion 11a that forms a side surface, and an upper surface portion that forms an upper surface; and the interior is of the casing 11 is hollow. For example, the casing 11 forms the side surface and the upper surface of the power module 100. For example, the casing 11 is formed from an insulating resin material. As shown in FIG. 2, for example, the side surface portion 11a is fixed to the end portion of the upper surface 10A of the base plate 10 by an adhesive. Therefore, the upper surface 10A of the base plate 10 other than the end portion is exposed in the internal space of the casing 11.

A direction along a long side of the upper surface 10A of the base plate 10 is taken as an X-direction for convenience of description in FIG. 2. A direction along a short side of the upper surface 10A perpendicular to the X-direction is taken as a Y-direction. A direction perpendicular to the XY plane is taken as a Z-direction. "Up" and "down" are used for convenience in the description; the direction in the Z-direction from the base plate 10 toward the internal space of the casing 11 is called up, and the opposite direction is called down; however, these expressions are for convenience and do not always match the direction of gravity.

As shown in FIG. 1, for example, four of the substrate units U1 are located on the base plate 10. For example, the four substrate units U1 are arranged in a matrix configuration of two rows and two columns. As shown in FIGS. 1 and 2, for example, the four substrate units U1 are located on the base plate 10, are separated from each other, and are separated from the side surface portion 11a of the casing 11.

The substrate unit U1 includes a substrate 20, a semiconductor chip 30 (a first semiconductor chip in the claims), a dam part 40, a metal member 50, and wires 61, 62, and 63 (hereinbelow, also generally referred to as the "wire 60").

As shown in FIGS. 1 and 2, the substrate 20 is, for example, substantially plate-shaped. The substrate 20 includes a base body 21, an electrode plate 22, and a back electrode plate 23.

The base body 21 includes, for example, silicon (Si) and nitrogen (N), and includes, for example, silicon nitride (SiN). The base body 21 is, for example, plate-shaped; and an upper surface 21A and a bottom surface of the base body 21 are flat surfaces.

As shown in FIG. 2, the electrode plates 22 are located at the upper surface 21A of the base body 21, are separated from each other, and have a prescribed wiring configuration. The electrode plates 22 include, for example, electrode plates 22a, 22b, 22c, 22d, and 22e.

The back electrode plate 23 is located at the bottom surface of the base body 21. As shown in FIG. 2, for example, the back electrode plate 23 has a planar shape that is substantially similar to the bottom surface of the base body 21 and slightly smaller than the bottom surface of the base body 21. The back electrode plate 23 covers the portion of the bottom surface of the base body 21 other than the edge. For example, the back electrode plate 23 of the substrate 20 is fixed to the upper surface 10A of the base plate 10 by soldering. Thereby, the substrate unit U1 is located at the upper surface 10A of the base plate 10.

For example, the electrode plates 22a, 22b, 22c, 22d, and 22e and the back electrode plate 23 are formed by stamping the same copper plate; and the thicknesses of the electrode plates 22a, 22b, 22c, 22d, and 22e (hereinafter, also called simply the thickness of the electrode plate 22) and the thickness of the back electrode plate 23 are, for example, equal. Although specifically, the upper surface of the substrate 20 is an uneven surface made of the upper surface 21A of the base body 21 and the upper surfaces and side surfaces of the electrode plates 22, the upper surface of the substrate 20 is a surface that is substantially parallel to the upper surface 10A of the base plate 10.

The semiconductor chip 30 is, for example, a semiconductor chip that controls the current amount of a MOSFET or the like and is, for example, a semiconductor chip that has rectification such as a diode, etc. As shown in FIG. 3, the semiconductor chip 30 includes an upper surface electrode 31 and a back electrode 32. The upper surface electrode 31 is exposed at the upper surface of the semiconductor chip 30. The back electrode 32 is exposed at the bottom surface of the semiconductor chip 30. For example, the wire 61 (a first wire in the claims) is connected by ultrasonic bonding to the upper surface electrode 31. The back electrode 32 is connected and fixed to the upper surface of the electrode plate 22a (a first electrode plate in the claims) by, for example, soldering.

As shown in FIGS. 2 and 3, the metal member 50 is located at the upper surface of the electrode plate 22c. The metal member 50 is, for example, substantially rectangular parallelepiped-shaped and includes an upper surface 50A, a side surface, and a bottom surface. The bottom surface of the metal member 50 is located at the upper surface of the electrode plate 22c at a mounting location. For example, the metal member 50 is bonded to the electrode plate 22c by soldering. The metal member 50 includes, for example, copper.

As shown in FIGS. 1 and 2, the dam part 40 is located at the upper surface of the substrate 20; specifically, the dam part 40 is located at the upper surface 21A of the base body 21. The dam part 40 is located along the edge of the substrate 20. As shown in FIGS. 1 and 2, the dam part 40 has a closed fence shape located at the inner perimeter of the edge of the substrate 20 when viewed from above. Thus, for example, the electrode plate 22 is not provided in the frame-shaped region along the edge of the upper surface 21A of the base body 21 because the dam part 40 is provided.

As shown in FIG. 3, the dam part 40 includes three bulges 40a that bulge in the direction X or the direction Y, and two pinched-in portions 40b that are between the bulges 40a. The inner side surface and the outer side surface of the dam part 40 are uneven surfaces. The bulges 40a of the dam part 40 at the short sides shown in FIG. 3 bulge in the direction X; and the bulges 40a of the dam part 40 at the long sides bulge in the direction Y. The number of the bulges 40a is not limited to three and may be two, four, or more. There are also cases where the bulges 40a and the pinched-in portions 40b are not distinctly identifiable.

The dam part 40 includes, for example, polymer silicone; for example, the dam part 40 is a polymer silicone resin, and is a cured silicone adhesive. The elastic modulus of the dam part 40 is, for example, about 10 MPa.

For example, the wire 60 is wire-shaped and is formed of aluminum (Al). As shown in FIG. 2, the wire 60 includes the wires 61 and 62 that perform connections inside the substrate unit U1, and the wire 63 (a second wire in the claims) that performs a connection between the substrate units U1. The lengths of the wires 61 and 62 are substantially equal; for example, the wire 63 is longer than the wires 61 and 62. The diameters of the wires 61, 62, and 63 are, for example, equal.

As shown in FIG. 3, the wire 61 is located inside the substrate unit U1. The wire 61 connects the upper surface electrode 31 of the semiconductor chip 30 and a prescribed electrode plate 22b (a second electrode plate in the claims). The wire 61 includes a chip connection portion 61a located at one end, an electrode plate connection portion 61b located at the other end, and a curved portion 61c. The chip connection portion 61a is connected with the upper surface electrode 31 of the semiconductor chip 30. The electrode plate connection portion 61b is connected with the electrode plate 22b. The curved portion 61c is curved upward between the chip connection portion 61a and the electrode plate connection portion 61b.

As shown in FIG. 2, the wire 62 is located inside the substrate unit U1. The wire 62 connects between the electrode plate 22d and the electrode plate 22e. The wire 62 includes a curved portion 62c, and electrode plate connection portions 62b that are located respectively at the two ends. The two electrode plate connection portions 62b are connected respectively to the electrode plates 22d and 22e. The curved portion 62c is curved upward between the two electrode plate connection portions 62b.

As shown in FIG. 2, among the four substrate units U1, for example, the wire 63 straddles a first substrate unit U11 and a second substrate unit U12 that are adjacent to each other. The wire 63 includes a curved portion 63c (a middle portion in the claims), and electrode plate connection portions 63b that are located respectively at the two ends. One of the electrode plate connection portions 63b is connected to the electrode plate 22c of the first substrate unit U11. The other of the electrode plate connection portions 63b is connected to the electrode plate 22a of the second substrate unit U12.

As shown in FIG. 2, the electrode plate 22c of the first substrate unit U11 is located at a portion of the first substrate unit U11 adjacent to the dam part 40 and is adjacent to the second substrate unit U12. The electrode plate 22a of the second substrate unit U12 is located at a portion of the second substrate unit U12 adjacent to the dam part 40 and is adjacent to the first substrate unit U11. The curved portion 63c of the wire 63 straddles above the dam part 40 of the first substrate unit U11 and the dam part 40 of the second substrate unit U12.

For example, the chip connection portion 61a and the electrode plate connection portions 61b, 62b, and 63b are connected by ultrasonic bonding. Thereby, the chip connection portion 61a and the electrode plate connection portions 61b, 62b, and 63b are hardened by alloying, and there are also cases where the chip connection portion 61a and the electrode plate connection portions 61b, 62b, and 63b have, for example, bulging spherical shapes.

The heights of the configurations from the upper surface of the substrate 20 will now be described. To unify the reference of the heights, "the height from the upper surface of the substrate 20" does not specifically include the electrode plate 22 and is taken to be the height referenced to the upper surface 21A of the base body 21. A reference to simply the "height" of each configuration refers to the height from the upper surface of the substrate 20. The height of a portion refers to the height of the upper end of the portion.

As shown in FIG. 4, a height H61a of the chip connection portion 61a is greater than a height H61b of the electrode plate connection portion 61b, a height H62b of the electrode plate connection portion 62b, and a height H63b of the electrode plate connection portion 63b by the amount of, for example, the thickness of the semiconductor chip 30. For example, the height H61a of the chip connection portion 61a is substantially equal to the sum of the thickness of the electrode plate 22, the thickness of the semiconductor chip 30, and the diameter of the wire 61. The thickness is the length in the direction Z. The height H61b of the electrode plate connection portion 61b, the height H62b of the electrode plate connection portion 62b, and the height H63b of the electrode plate connection portion 63b are substantially equal to the sum of the thickness of the electrode plate 22 and the diameters of the wires 61, 62, and 63. The heights H61b, H62b, and H63b are substantially equal. A height H61c of the curved portion 61c is greater than a height H62c of the curved portion 62c and less than a height H63c of the curved portion 63c.

A height H40 of the dam part 40 is greater than the height H61a of the chip connection portion 61a. The height H40 of the dam part 40 may be less than a height H50A of the upper surface 50A of the metal member 50. The height H50A of the upper surface 50A of the metal member 50 is, for example, substantially equal to the sum of the thickness of the electrode plate 22 and the thickness of the metal member 50.

The height H40 of the dam part 40 may be less than a height H61 of the curved portion 61c of the wire 61, and is less than the height H63c of the curved portion 63c of the wire 63 and greater than the height H62c of the curved portion 62c of the wire 62.

As shown in FIGS. 1 and 2, the terminal plate 80 includes external connection terminal plates 81 and 82 and multiple internal wiring terminal plates 83. The external connection terminal plates 81 and 82 input electrical power from an external power supply and externally output electrical power converted by the multiple semiconductor chips 30. For example, the internal wiring terminal plate 83 transmits signals inside the power module 100.

As shown in FIG. 2, for example, the external connection terminal plate 82 and the internal wiring terminal plate 83 are held by being pre-formed as a continuous body in the side surface portion 11a of the casing 11. The external connection terminal plate 81 is held by being clamped between the side surface portion 11a and the upper surface portion of the casing 11. As shown in FIG. 2, pluralities of the external connection terminal plates 81 and 82 and the internal wiring terminal plate 83 (also generally referred to as the "terminal plate 80" hereinafter) extend around in the internal space of the casing 11.

The terminal plate 80 will now be elaborated as an example of one external connection terminal plate 82 according to the embodiment.

As shown in FIG. 3, the external connection terminal plate 82 includes a bonding portion 82a (also generally referred to as the "bonding portion 80a" hereinafter), a curved portion 82b (also generally referred to as the "curved portion 80b" hereinafter), an interconnect portion 82c (also generally referred to as the "interconnect portion 80c" hereinafter), and a draw-out portion 82d.

The bonding portion 82a is an end portion of the external connection terminal plate 82, is connected to the upper surface 50A of the metal member 50, and is substantially parallel to the upper surface 50A. The bonding portion 82a is bonded to the upper surface 50A of the metal member 50 by, for example, ultrasonic bonding, etc.

The curved portion 82b is linked to the bonding portion 82a and is curved upward from a direction parallel to the upper surface 50A.

The interconnect portion 82c extends upward from the curved portion 82b and is routed in the internal space of the casing 11.

The draw-out portion 82d is externally drawn out of the casing 11 from the interconnect portion 82c.

As shown in FIG. 2, the first resin layer 91 and the second resin layer 92 are sealing materials. The first resin layer 91 includes, for example, an epoxy resin. The second resin layer 92 includes, for example, polymer silicone, is an insulative gel resin, and is, for example, transparent or semi-transparent. The first resin layer 91 and the second resin layer 92 are insulative.

As shown in FIGS. 2 and 3, the first resin layer 91 is located in the substrate unit U1. The first resin layer 91 is located inward of the dam part 40 on the substrate 20 and fills the inner side of the dam part 40. Accordingly, the bottom surface of the first resin layer 91 contacts an upper surface 20A of the substrate 20 and does not contact the upper surface 10A of the base plate 10. The dedicated surface area of the first resin layer 91 is less than the surface area of the substrate 20. The first resin layer 91 also contacts the inner side surface of the dam part 40 which is an uneven surface. Thereby, the side surface of the first resin layer 91 is an uneven surface.

As shown in FIG. 4, a height H91 of the first resin layer 91 is equal to or less than the height H40 of the dam part 40. The height H91 of the first resin layer 91 is greater than the height H61a of the chip connection portion 61a and less than the height H50A of the upper surface 50A of the metal member 50. The first resin layer 91 surrounds the chip connection portion 61a but does not surround the upper surface 50A of the metal member 50.

As shown in FIGS. 2 and 3, the first resin layer 91 contacts the side surface of the metal member 50, the upper surface and the side surface of the semiconductor chip 30, the chip connection portion 61a, the electrode plate connection portions 61b, 62b, and 63b, and the curved portion 62c of the wire 62. The first resin layer 91 does not surround the curved portion 61c of the wire 61 and the curved portion 63c of the wire 63 and does not contact the curved portions 61c and 63c.

The height H91 of the first resin layer 91 is greater than the height H61b of the electrode plate connection portion 61b, the height H62b of the electrode plate connection portion 62b, and the height H63b of the electrode plate connection portion 63b. The height H91 of the first resin layer 91 is less than the height H61c of the curved portion 61c of the wire 61 and the height H63c of the curved portion 63c of the wire 63 and greater than the height H62c of the curved portion 62c of the wire 62. Therefore, the curved portion 61c of the wire 61 and the curved portion 63c of the wire 63 protrude from the upper surface of the first resin layer 91 and are located outside the first resin layer 91.

As shown in FIG. 2, the second resin layer 92 fills the internal space of the casing 11 and buries the substrate unit U1 together with the first resin layer 91. Accordingly, the second resin layer 92 is located also on the first resin layer 91 and the substrate unit U1. The curved portion 61c of the wire 61 and the curved portion 63c of the wire 63 are located inside the second resin layer 92. The second resin layer 92 is located also in the gap between the substrate unit U1 and the side surface portion 11a of the casing 11 and gaps between the adjacent substrate units U1 among the four substrate units U1.

The bottom surface of the second resin layer 92 contacts the upper surface of the first resin layer 91, the upper portion of the dam part 40, and the upper surface 10A of the base plate 10. The locations at which the second resin layer 92 contacts the upper surface 10A of the base plate 10 are the gaps between the side surface portion 11a and the four substrate units U1 and the gaps between two adjacent substrate units U1. The second resin layer 92 contacts the side surface portion 11a of the casing 11.

The second resin layer 92 also contacts the upper surface and the outer side surface of the dam part 40, the upper surface 50A, the side surface, and the upper end portion of the metal member 50, the bonding portion 80a and the curved portion 80b of the terminal plate 80, and the portion of the interconnect portion 80c at the lower end side. The second resin layer 92 contacts the outer side surface of the dam part 40 that is an uneven surface. As shown in FIG. 3, the second resin layer 92 fills a wedge-like space β between the bottom surface of the curved portion 82b and the upper surface 50A of the metal member 50.

Thus, the insulation properties of the upper surface 10A of the base plate 10, the substrate 20, the electrode plate 22, the semiconductor chip 30, the dam part 40, the metal member 50, the wire 60, and the terminal plate 80 that are located in the internal space of the casing 11 are guaranteed by covering with the first resin layer 91 or the second resin layer 92.

The elastic modulus of the second resin layer 92 is less than the elastic modulus of the first resin layer 91. The elastic modulus of the dam part 40 is greater than the elastic modulus of the second resin layer 92 and less than the elastic modulus of the first resin layer 91. The thermal expansion coefficient of the second resin layer 92 is greater than the thermal expansion coefficient of the first resin layer 91.

Operations of the power module 100 according to the embodiment will now be described.

In the power module 100, for example, electrical power is supplied via the external connection terminal plate 82; a signal is transmitted via the internal wiring terminal plate 83; and a current that is controlled by the multiple semiconductor chips 30 is output to an external device via the external connection terminal plate 81. The heat that is generated by the conduction is conducted to the substrate 20 and to the first and second resin layers 91 and 92 that fill the internal space of the casing 11.

The thermal expansion coefficient of the first resin layer 91 is less than the thermal expansion coefficient of the second resin layer 92; and the expansion of the first resin layer 91 due to heat is micro and is small compared to that of the second resin layer 92. The elastic modulus of the first resin layer 91 is greater than the elastic modulus of the second resin layer 92; and the first resin layer 91 is not easily deformed by an external force. Therefore, the inner side surface of the dam part 40 contacted by the first resin layer 91, the upper surface 21A of the base body 21, the upper surface and the side surface of the electrode plate 22, the lower end portion of the side surface of the metal member 50, the upper surface and the side surface of the semiconductor chip 30, the chip connection portion 61a and the electrode plate connection portion 61b of the wire 61, the electrode plate connection portion 62b and the curved portion 62c of the wire 62, and the electrode plate connection portion 63b of the wire 63 continue to contact the first resin layer 91. In particular, fatigue fracture due to thermal cycles is suppressed because the chip connection portion 61a and the electrode plate connection portions 62b and 63b are hardened by bonding and are fixed in the first resin layer 91.

On the other hand, the volume of the second resin layer 92 changes according to the temperature; the elastic modulus of the second resin layer 92 is less than the elastic modulus of the first resin layer 91; and the second resin layer 92 is soft and flowable. Accordingly, the second resin layer 92 continues to contact the upper surface of the first resin layer 91, the upper surface 10A of the base plate 10, the side surface portion 11a of the casing 11, and the side surface of the substrate 20 even when the temperature of the second resin layer 92 changes.

The second resin layer 92 does not detach and continues to contact the terminal plate 80 and the upper surface 50A, the side surface, and the upper end portion of the metal member 50. As shown in FIG. 3, in particular, the second resin layer 92 also does not detach from the upper surface 50A of the metal member 50 and the bottom surface of the curved portion 82b of the terminal plate 82 located inside the second resin layer 92 and fills the wedge-like space β. Thereby, the second resin layer 92 guarantees the insulative properties of the terminal plate 82 and the metal member 50.

The second resin layer 92 surrounds and continues to contact the curved portion 61c of the wire 61 and the curved portion 63c of the wire 63. In particular, for the wire 63 that is longer than the other wires 61 and 62 and has a length that changes more due to the temperature change, the second resin layer 92 guarantees the insulative properties of the curved portion 63c because the second resin layer 92 can continue to contact the curved portion 63c while allowing the change of the length of the wire 63 due to the temperature change.

The second resin layer 92 also contacts the outer side surface of the dam part 40. Deformation and/or damage of the dam part 40 due to stress from the second resin layer 92 is suppressed because the first resin layer 91 has the same height as the dam part 40 or is slightly lower than the dam part 40 and is located in the interior of the dam part 40.

The substrate 20 dissipates the heat generated in the substrate unit U1 by transmitting the heat to the base plate 10 via the back electrode plate 23. On the other hand, the base plate 10 expands or contracts due to the temperature change; but the base plate 10 bends because, for example, the back electrode plate 23 is soldered to the greater part of the upper surface 10A of the base plate 10.

Although the substrate 20 bends in the same direction following the bend of the base plate 10, the substrate 20 is smaller than the base plate 10; therefore, the stress is relaxed. Thereby, the first resin layer 91 that is located on the substrate 20 is prevented from detaching from the upper surface 20A of the substrate 20 and the inner side surface of the dam part 40; and the occurrence of cracks is suppressed.

The side surface of the first resin layer 91 is not easily affected by the stress from the second resin layer 92 because the side surface of the first resin layer 91 is covered with the inner side surface of the dam part 40 that has a lower elastic modulus than the first resin layer 91. Also, the uneven surface that is formed in the inner side surface of the dam part 40 that has a lower elastic modulus than the first resin layer 91 and the uneven surface that is formed in the side surface of the first resin layer 91 contact and engage each other; therefore, detachment and damage of the dam part 40 and the first resin layer 91 do not occur easily even when stress is applied from the second resin layer 92 and the substrate 20.

In the power module 100, the four substrate units U1 are located substantially uniformly on the upper surface 10A of the base plate 10; therefore, the four substrate units U1 are not easily affected by the bend of the base plate 10; and the detachment and the occurrence of cracks of the first resin layer 91 are further suppressed. Also, it is difficult for the first resin layer 91 to be detached by bending because the surface area of each of the first resin layers 91 is small.

The detachment of the first resin layer 91 due to bending of the base plate 10 is suppressed because the first resin layer 91 that has a high elastic modulus does not contact the base plate 10. On the other hand, the second resin layer 92 that has a low elastic modulus is not detached even when the base plate 10 bends because the lower portion of the second resin layer 92 contacts the upper surface 10A of the base plate 10 and the side surface portion 11a of the casing 11.

A method for manufacturing the power module according to the embodiment will now be described.

FIGS. 5A to 6B are cross-sectional views showing the method for manufacturing the power module according to the embodiment.

First, the substrate 20 is prepared.

Figure 5A:
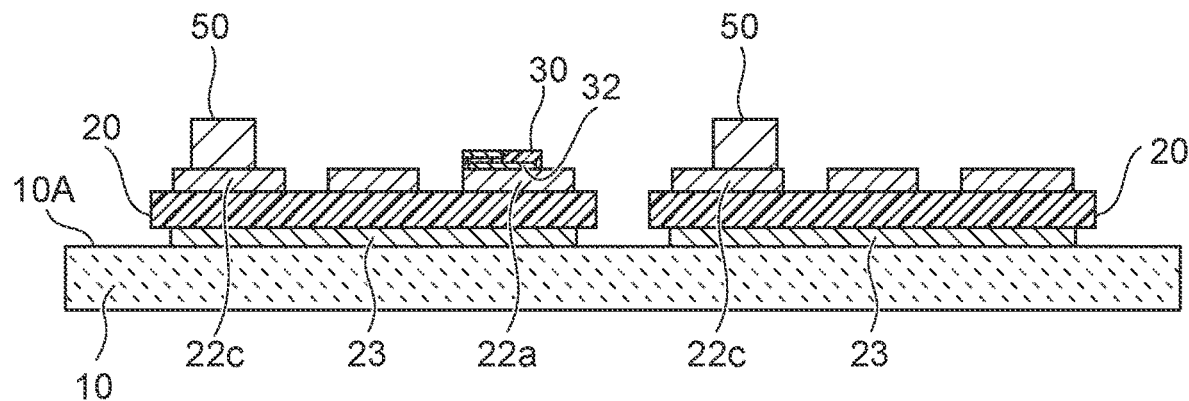
FIGS. 5A to 6B are cross-sectional views showing a method for manufacturing the power module according to the embodiment.

As shown in FIG. 5A, for example, the back electrodes 32 of the multiple semiconductor chips 30 are soldered to the prescribed locations of the electrode plates 22a of the substrates 20; for example, the bottom surfaces of the multiple metal members 50 are soldered to the prescribed locations of the electrode plates 22c of the substrates 20; for example, the back electrode plates 23 of the substrates 20 are fixed to the upper surface 10A of the base plate 10 by soldering.

Figure 5B:
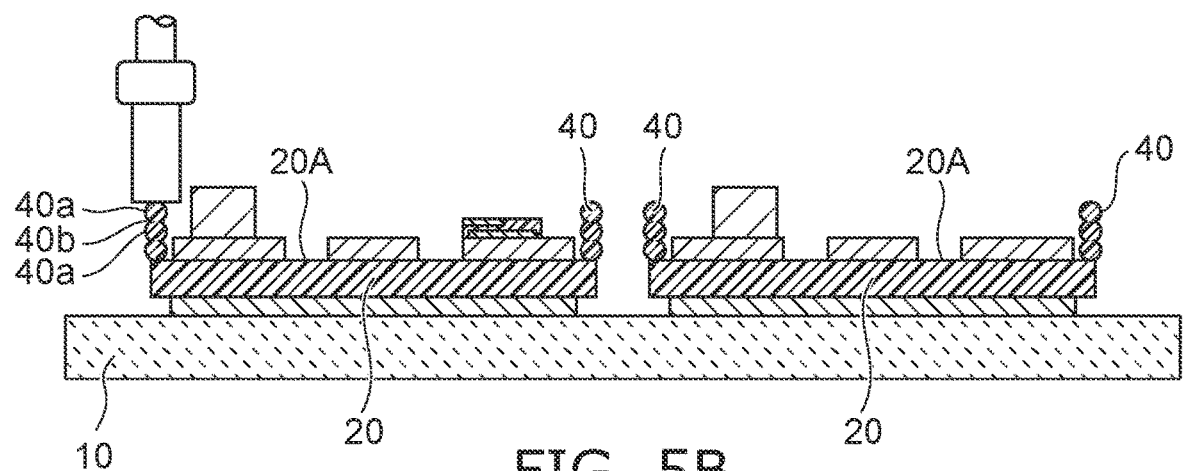

Then, as shown in FIG. 5B, for example, the dam part 40 is formed of a damming agent, i.e., a silicone-based adhesive. It is favorable for the damming agent to have good thixotropy. As shown in FIG. 1, one bulge 40a of the dam part 40 is formed by, for example, coating a damming agent three times around the inner perimeter of the edge of the upper surface 20A of the substrate 20 and by curing by heating. As shown in FIG. 5B, the dam part 40 that includes three bulges 40a and two pinched-in portions 40b is formed by repeating the process of coating and curing the damming agent three times.

Figure 6A:
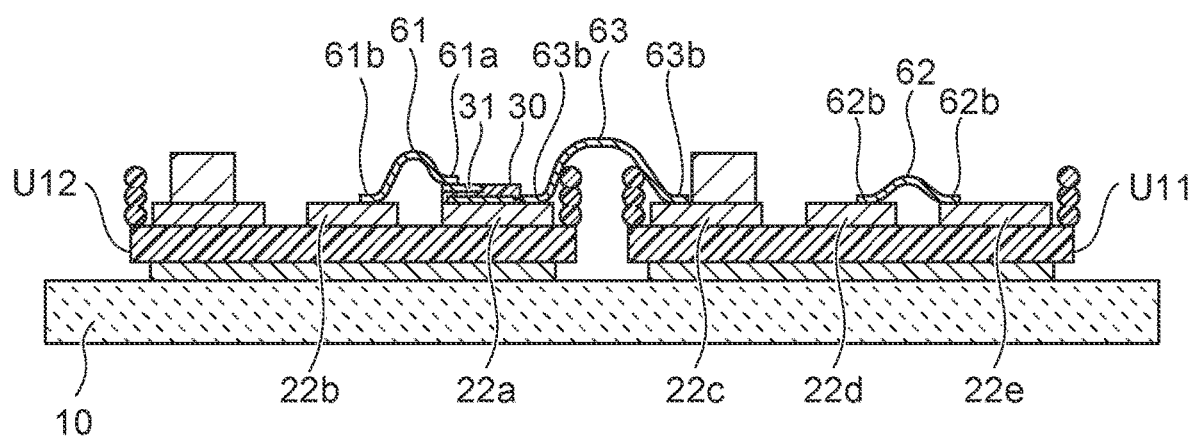

Continuing as shown in FIG. 6A, for example, the multiple wires 61, 62, and 63 are bonded by ultrasonic bonding.

One end of the wire 61 is bonded to the electrode plate 22b; the other end is bonded to the upper surface electrode 31 of a prescribed semiconductor chip 30. The two ends of the wire 62 are bonded respectively to the electrode plates 22d and 22e. The two ends of the wire 63 are respectively bonded to the electrode plate 22c of the first substrate unit U11 and the electrode plate 22a of the second substrate unit U12.

Figure 6B:
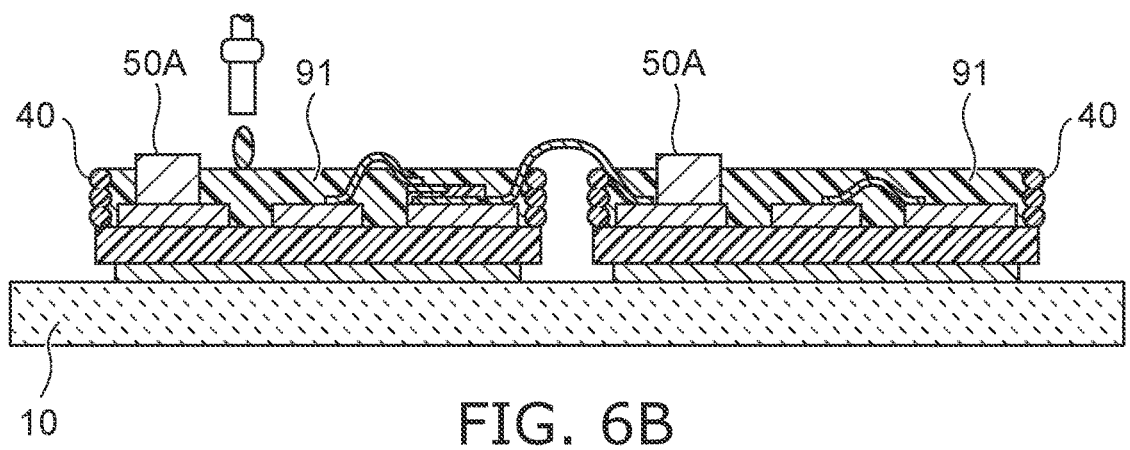

Then, the first resin layer 91 is formed as shown in FIG. 6B. For example, the first resin layer 91 is formed by dispensing a liquid resin that includes an epoxy to a height that is not more than the height of the dam part 40 at the inner side of the dam part 40 and by, for example, thermally curing.

As shown in FIG. 4, the height H91 of the first resin layer 91 is less than the height H50A of the upper surface 50A of the metal member 50; therefore, the cleanliness of the upper surface 50A of the metal member 50 is maintained. Thereby, for example, the bondability of the ultrasonic bonding or the like between the bonding portion 80a of the terminal plate 80 and the upper surface 50A of the metal member 50 is good. By using the metal member 50 so that the bonding location of the terminal plate 80 is high, the first resin layer 91 can be formed before the bonding operation of the bonding portion 80a of the terminal plate 80. Therefore, the manufacturability is good because the first resin layer 91 can be formed in a state in which the side surface portion 11a of the casing 11 and the multiple terminal plates 80 are not provided as shown in FIG. 6B.

Continuing as shown in FIG. 3, for example, an adhesive is coated on the end portion of the base plate 10; and the side surface portion 11a is assembled. Thereby, the bonding portions 82a and 83a of the multiple external connection terminal plates 82 and the internal wiring terminal plate 83 that are pre-formed in the side surface portion 11a of the casing 11 are caused to contact the prescribed locations of the metal members 50.

Then, the external connection terminal plate 81 is placed on the prescribed location of the side surface portion 11a; and a bonding portion 81a of the external connection terminal plate 81 contacts the prescribed metal member 50. The metal members 50 that correspond to the bonding portions 81a, 82a, and 83a of the terminal plate 80 are bonded by, for example, ultrasonic bonding.

Then, the second resin layer 92 is filled into the internal space of the casing 11; and the upper surface portion of the casing 11 is assembled with the side surface portion 11a. Thereby, the second resin layer 92 is sealed with the casing 11; and the external connection terminal plate 81 is held between the upper surface portion and the side surface portion 11a of the casing 11.

Although four substrate units U1 are included in the embodiment, one or more is sufficient; and the substrate units U1 are not limited to the same configuration. When multiple substrate units U1 are included, it is unnecessary for all of the substrate units U1 to include the metal member 50. Specifically, the metal member 50 may not be included in one substrate unit U1 if the terminal plate 80 is not connected on the one substrate unit U1.

Although the metal member 50 is located on the electrode plate 22c, the metal member 50 is not limited thereto. Specifically, for example, the metal member 50 may be located in available regions on the other electrode plates 22a, 22b, 22d, and 22e as long as the circuit wiring can be configured. The wire 63 that connects between the two substrate units U1 is not limited to the embodiment; for example, the wire 63 may be connected to available regions on the other electrode plates 22*b*, 22*d*, and 22*e* and may be directly connected to an upper surface electrode (a second electrode in the claims) of another semiconductor chip (a second semiconductor chip in the claims) as long as the circuit wiring can be configured.

Although the dam part 40 according to the embodiment is located at the upper surface 21A of the base body 21, the dam part 40 is not limited thereto; for example, the dam part 40 may be partially provided on the electrode plate 22; and the height H40 of the dam part 40 may be partially different. Also, the height H40 of the dam part 40 may be different between the substrate units U1; specifically, the height of the dam part 40 may be changed by changing the number of rounds or the speed of dispensing the damming agent. It is favorable for the number of the bulges 40*a* of the dam part 40 to be not less than two; and two or three bulges 40*a* are favorable.

Although the dam part 40 is formed in a closed fence shape at the inner perimeter of the edge of the substrate 20 when viewed from above without another structure interposed, the dam part 40 is not limited thereto. For example, the dam part 40 may be formed along the edge of the substrate 20 at the inner perimeter of the edge to have a closed fence shape into which, for example, a metal member 50, a resin piece, or the like is interposed. The dam part 40 is not limited to being located along the edge of the substrate 20 and may be located inward on the substrate 20.

Effects of the power module according to the embodiment will now be described.

According to the power module according to the embodiment, the substrate unit U1 that includes the substrate 20 is located on the upper surface 10A of the base plate 10; the fence-shaped dam part 40 is located at the inner perimeter of the edge of the substrate 20; and the first resin layer 91 is formed inward of the dam part 40 at the upper surface 20A of the substrate 20. Thereby, the first resin layer 91 does not contact the base plate 10 and is located on the substrate 20 of which the bending is relaxed; therefore, even when the base plate 10 is bent by a temperature change, the detachment and the occurrence of cracks can be suppressed, and the insulation properties as a sealing material can be guaranteed.

According to the power module 100 according to the embodiment, the substrate unit U1 that has a narrower surface area than the upper surface 10A of the base plate 10 is included; therefore, each of the substrates 20 is not easily affected by the bending of the base plate 10; the detachment and the occurrence of cracks of the first resin layer 91 can be further suppressed; and the insulation properties due to the first resin layer 91 can be guaranteed.

The first resin layer 91 surrounds the chip connection portion 61*a* and the electrode plate connection portions 61*b*, 62*b*, and 63*b* of the wires 61, 62, and 63. Accordingly, the chip connection portion 61*a* and the electrode plate connection portions 61*b*, 62*b*, and 63*b* that are hardened by bonding are fixed in the first resin layer 91 that does not easily deform; therefore, damage due to the stress loading is suppressed.

According to the embodiment, the second resin layer 92 fills the internal space of the casing 11 and is located on the first resin layer 91 and the substrate unit U1. Thereby, the second resin layer 92 that has a low elastic modulus contacts the upper surface 10A of the base plate 10, the side surface portion 11*a* of the casing 11, and the side surface of the substrate 20 and is not easily detached by the bending of the base plate 10. The second resin layer 92 is difficult to detach from the upper surface 50A, the side surface, and the upper end portion of the metal member 50 and the terminal plate 80; and the insulation properties can be guaranteed. The second resin layer 92 surrounds the curved portion 61*c* of the wire 61 and the curved portion 63*c* of the wire 63 and can guarantee the insulative properties of the curved portions 61*c* and 63*c* while allowing a slight deformation due to the temperature change of the wires 61 and 63.

According to the power module 100 according to the embodiment, the first resin layer 91 is formed in the interior of the fence-shaped dam part 40. The height of the dam part 40 is set to be greater than the height of the chip connection portion 61*a*; and the height of the first resin layer 91 is set to be greater than the height of the chip connection portion 61*a*, not more than the height of the dam part 40, and less than the height of the upper surface 50A of the metal member 50. Thereby, the chip connection portion 61*a* and the electrode plate connection portions 61*b*, 62*b*, and 63*b* can be located inside the first resin layer; the entire terminal plate 80 can be located inside the second resin layer 92; and the insulation properties can be guaranteed. The bondability between the bonding portion 80*a* and the upper surface 50A of the metal member 50 can be good, and the bonding operation can be easy. By forming the first resin layer 91 inward of the dam part 40, the deformation and/or the damage of the dam part 40 due to the stress applied from the second resin layer 92 and the substrate 20 can be suppressed, and the detachment and the occurrence of cracks of the first resin layer 91 can be suppressed.

According to the power module 100 according to the embodiment as described above, even for operation conditions such that the temperature change due to the conduction is large, the insulation properties can be guaranteed while suppressing the damage of the internal configuration; and the reliability can be increased.

When the first resin layer 91 is not provided inward of the dam part 40 on the substrate 20 as in the power module 100 of the embodiment, for example, the first resin layer contacts the substrate at the center vicinity of the bottom surface and contacts the side surface portion of the casing and the base plate at the edge of the bottom surface. In such a case, the first resin layer contacts the side surface portion of the casing and the base plate at the edge at which the displacement amount due to the bending of the base plate is large; therefore, the edge portion easily detaches from the base plate and the side surface portion of the casing; and cracks easily occur. Also, the first resin layer occupies the greater part of the upper surface of the base plate and has a large surface area; therefore, the edges detach more easily; and cracks easily occur. Conversely, according to the power module according to the embodiment, even for operation conditions such that the temperature change due to the conduction is large, the insulation properties can be guaranteed while suppressing the damage of the internal configuration; and the reliability can be increased.

According to embodiments described above, a highly-reliable power module can be realized.

Hereinabove, exemplary embodiments of the invention are described with reference to specific examples. However, the invention is not limited to these specific examples. For example, various modifications made by one skilled in the art in regard to the configurations, sizes, material qualities, arrangements, etc., of components of power modules such as electrode plates, metal members, terminal plates, semiconductor chips, dam parts, and first resin layers are included in the scope of the invention to the extent that the purport of the invention is included. In particular, the material properties of the electrode plates, the terminal plates, and the wires are not limited to copper or aluminum; other metals may be used; and the metals may be different from each other. Furthermore, any two or more components of the specific examples may be combined within the extent of technical feasibility and are included in the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power module, comprising:
   a base plate;
   a casing located on the base plate;
   at least one substrate unit located on the base plate, each of the at least one substrate unit including
      a substrate fixed on the base plate, the substrate including a plurality of electrode plates at an upper surface of the substrate, the plurality of electrode plates including at least first and second electrode plates,
      a dam part located on the substrate, the dam part being formed along an edge of the substrate when viewed from above,
      a first semiconductor chip located on the first electrode plate, the first semiconductor chip including a first electrode,
      a metal member located on one of the electrode plates, and
      a first wire including
         an electrode plate connection portion connected to the second electrode plate,
         a chip connection portion connected to the first electrode, and
         a curved portion positioned between the electrode plate connection portion and the chip connection portion;
      a terminal plate bonded to an upper surface of the metal member, the terminal plate including
         a bonding portion connected to the upper surface of the metal member and being parallel to the upper surface of the metal member,
         a curved portion being linked to the bonding portion and being curved upward from a direction parallel to the upper surface of the metal member,
   an interconnect portion being linked to the curved portion, and
   a draw-out portion being linked to the interconnect portion;
      a first resin layer located on the substrate inward of the dam part, the chip connection portion and the electrode plate connection portion being located inside the first resin layer; and
      a second resin layer located on the first resin layer and the dam part, the upper surface of the metal member being located inside the second resin layer, an elastic modulus of the second resin layer being less than an elastic modulus of the first resin layer, wherein
      a height of the dam part from an upper surface of the substrate is greater than a height of the chip connection portion from the upper surface of the substrate,
      a height of the first resin layer from the upper surface of the substrate is not more than the height of the dam part, is greater than the height of the chip connection portion, and is less than a height of the upper surface of the metal member from the upper surface of the substrate,
      a part of the second resin layer is located between the upper surface of the metal member and the curved portion of the terminal plate,
   the terminal plate is monolithically formed, and
   the draw-out portion of the terminal plate reaches to an uppermost surface of the casing, is exposed on the uppermost surface of the casing, and is not covered by the second resin layer.

2. The power module according to claim 1, wherein the casing includes a side surface portion, and the second resin layer contacts the base plate in a gap between the substrate unit and the side surface portion.

3. The power module according to claim 1, wherein an elastic modulus of the dam part is greater than the elastic modulus of the second resin layer and less than the elastic modulus of the first resin layer.

4. The power module according to claim 1, wherein the dam part includes a silicone resin, and the dam part includes at least two bulges and one pinched-in portion.

5. The power module according to claim 1, wherein the curved portion is located inside the second resin layer.

6. The power module according to claim 1, wherein a thermal expansion coefficient of the first resin layer is less than a thermal expansion coefficient of the second resin layer.

7. The power module according to claim 1, wherein the first resin layer includes an epoxy resin.

8. The power module according to claim 1, wherein the second resin layer is a gel.

9. The power module according to claim 1, comprising:
   two of the substrate units,
   one of the substrate units and the other of the substrate units being separated from each other on the base plate, and
   the second resin layer contacting the base plate in a gap between the two substrate units.

10. The power module according to claim 9, further comprising:
    a second wire,
    the one of the substrate units and the other of the substrate units further including second semiconductor chips located on one of the plurality of electrode plates of the one of the substrate units and the other of the substrate units,
    each of the second semiconductor chips including a second electrode,
    one end of the second wire being connected to the one of the plurality of electrode plates or the second electrode of the one of the substrate units,
    another end of the second wire being connected to the one of the plurality of electrode plates or the second electrode of the other of the substrate units, and
    a middle portion of the second wire being located in the second resin layer.

* * * * *